United States Patent
Hu et al.

(10) Patent No.: US 8,013,682 B2
(45) Date of Patent: Sep. 6, 2011

(54) FREQUENCY SYNTHESIZER AND METHOD FOR CONTROLLING SAME

(75) Inventors: Weiliang Hu, Kanagawa (JP); Noriaki Matsuno, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 139 days.

(21) Appl. No.: 12/470,503

(22) Filed: May 22, 2009

(65) Prior Publication Data

US 2009/0289724 A1 Nov. 26, 2009

(30) Foreign Application Priority Data

May 22, 2008 (JP) .................................. 2008-134212

(51) Int. Cl.
*H03L 7/00* (2006.01)
(52) U.S. Cl. ........... 331/16; 331/1 A; 331/17; 331/36 C; 331/177 R; 331/177 V
(58) Field of Classification Search .................. 331/1 A, 331/16, 17, 36 C, 36 R, 117 R, 167, 177 R, 331/177 V
See application file for complete search history.

(56) References Cited

U.S. PATENT DOCUMENTS

| | | | |
|---|---|---|---|
| 5,923,196 A | 7/1999 | Okamoto | |
| 5,986,514 A * | 11/1999 | Salvi et al. | 331/17 |
| 6,133,797 A * | 10/2000 | Lovelace et al. | 331/17 |
| 6,753,738 B1 * | 6/2004 | Baird | 331/25 |
| 6,791,425 B2 * | 9/2004 | Kitamura | 331/117 R |
| 7,471,160 B2 * | 12/2008 | Feng et al. | 331/17 |
| 2003/0048145 A1 * | 3/2003 | Albon et al. | 331/177 V |
| 2004/0150483 A1 * | 8/2004 | Cho | 331/117 R |
| 2008/0174379 A1 * | 7/2008 | Chen | 331/177 V |

FOREIGN PATENT DOCUMENTS

| | | |
|---|---|---|
| JP | 06-019327 | 1/1994 |
| JP | 06-326604 | 11/1994 |
| JP | 10-051304 | 2/1998 |
| JP | 2007-013898 | 1/2007 |

* cited by examiner

*Primary Examiner* — Joseph Chang
*Assistant Examiner* — Jeffrey Shin
(74) *Attorney, Agent, or Firm* — Young & Thompson (57) ABSTRACT

A frequency synthesizer includes compensation variable capacitance diodes 53 and 54 in a voltage-controlled oscillator 5 in addition to a variable capacitance diode 52 whose DC bias voltage is controlled by a control voltage signal 11 generated by a low-pass filter 3. A monitor circuit 8 monitors the control voltage signal 11 and changes the level of control signals 16 and 17 when the voltage of the control voltage signal 11 goes out of a range within which the capacitance of the variable capacitance diode 52 can be easily changed. A time constant circuit 72 supplies a DC bias voltage to the compensation variable capacitance diode for smoothing out the level change of the control signals 16 and 17 into a slow voltage change so that a locked state is not canceled.

14 Claims, 10 Drawing Sheets

FIG. 1 CONVENTIONAL CASE

FIG. 2 REFERENCE CASE

FREQUENCY SYNTHESIZER AND METHOD FOR CONTROLLING SAME

TECHNICAL FIELD

Reference to Related Application

This application is based upon and claims the benefit of the priority of Japanese patent application No. 2008-134212, filed on May 22, 2008, the disclosure of which is incorporated herein in its entirety by reference thereto.

The present invention relates to a frequency synthesizer and method for controlling same, and particularly to a frequency synthesizer having a voltage-controlled oscillator that uses a variable capacitance diode and method for controlling the same.

BACKGROUND

Figure 1:
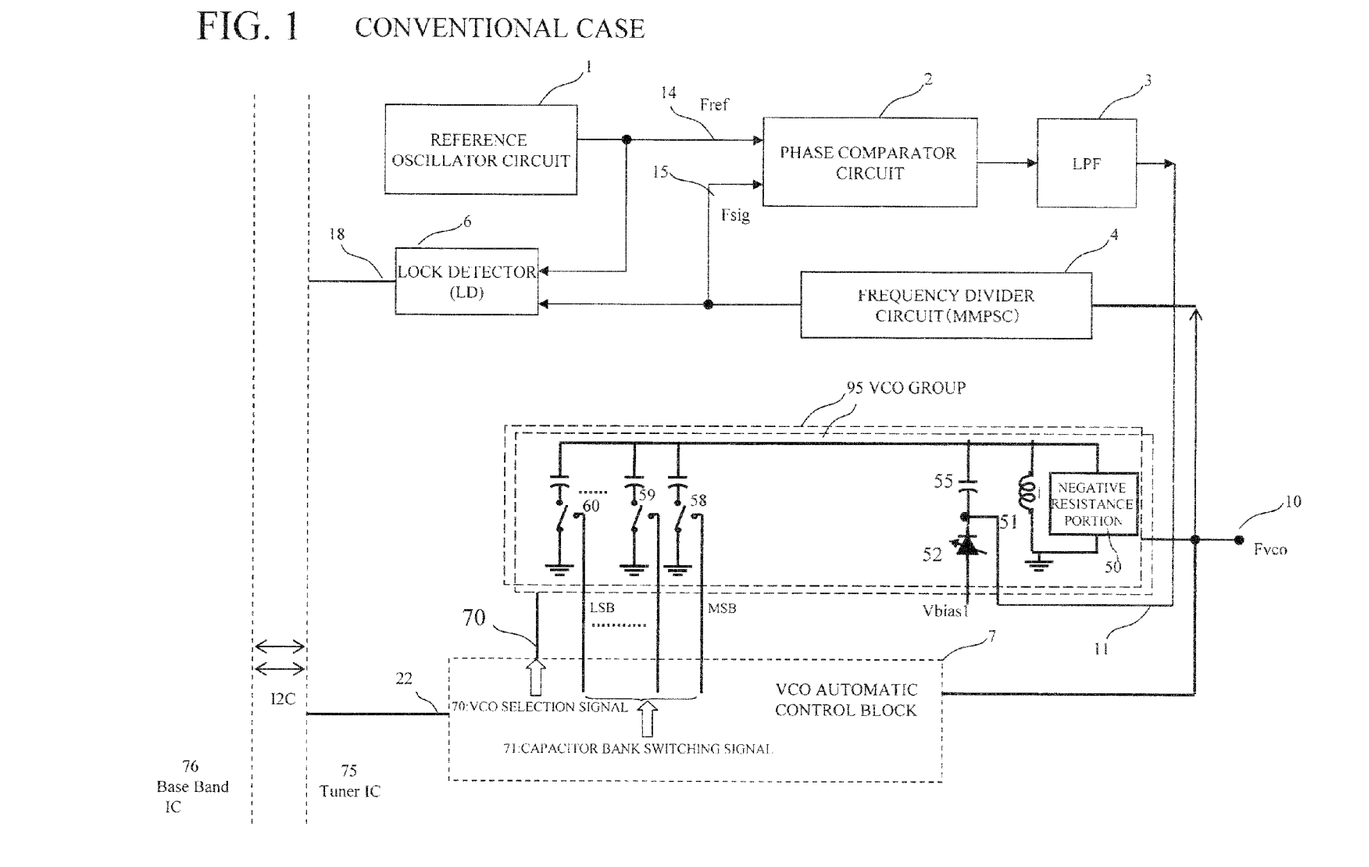
FIG. 1 is a block diagram of a conventional and general frequency synthesizer.

Conventionally, a frequency synthesizer using a PLL is widely used in radio communication device and tuner. FIG. 1 is a configuration diagram of a general frequency synthesizer using a PLL. The frequency synthesizer shown in FIG. 1 includes a reference oscillator circuit 1 that generates a reference clock 14, a phase comparator circuit 2 that detects the phase difference between the reference clock 14 and a feedback clock 15 and that outputs a pulse corresponding to the phase difference, a low-pass filter (LPF) 3 that smoothes the pulse outputted from the phase comparator circuit 2 and generates a control voltage signal 11, a voltage-control led oscillator (VCO) group 95 in which a plurality of voltage-controlled oscillators (VCO) that oscillate at an oscillation frequency that depends on the control voltage signal 11 are provided, and a frequency divider circuit 4 that divides the frequency of an output signal 10 generated by the voltage-controlled oscillator (VCO) group 95 and generates the feedback clock 15. When the phase difference between the reference clock 14 and the feedback clock 15 is detected, whether or not the phase difference is stably within a predetermined range is also detected. In the case where the phase difference is stably within the predetermined range, the frequency synthesizer further comprises a lock detector (LD) 6 that outputs a lock detection signal 18 to the outside. Further, this frequency synthesizer is provided in a tuner IC 75 and is connected to a base band IC 76 via a bus interface such as an 12C (Inter-Integrated Circuit) bus.

Next, the structure of the voltage-controlled oscillator (VCO) group 95 will be described in detail. The voltage-controlled oscillator (VCO) group 95 includes a plurality of voltage-controlled oscillators with different characteristics such as the range of the oscillation frequency. A voltage-controlled oscillator is comprised of a plurality of capacitance elements, a negative resistance portion 50, and an inductor 51. The plurality of capacitance elements are constituted by a plurality of fixed capacitances connected in parallel to each other and respectively on/off controlled by switches 58, 59, and 60, a variable capacitance diode (varactor for fine-tuning the frequency) 52 whose DC bias voltage is controlled by the control voltage signal 11, and a fixed capacitance 55 connected to the variable capacitance diode 52 in series. The capacitance value of the voltage-controlled oscillator is roughly determined by the aforementioned switches. The oscillation frequency is determined by fine-tuning the capacitance value using the voltage value of the control voltage signal.

Further, a VCO automatic control block 7 selects one voltage-controlled oscillator from the plurality of VCOs and turns on/off the switches that determine the approximate capacitance value, based on a command sent from the base band IC 76 via the bus.

Figure 2:
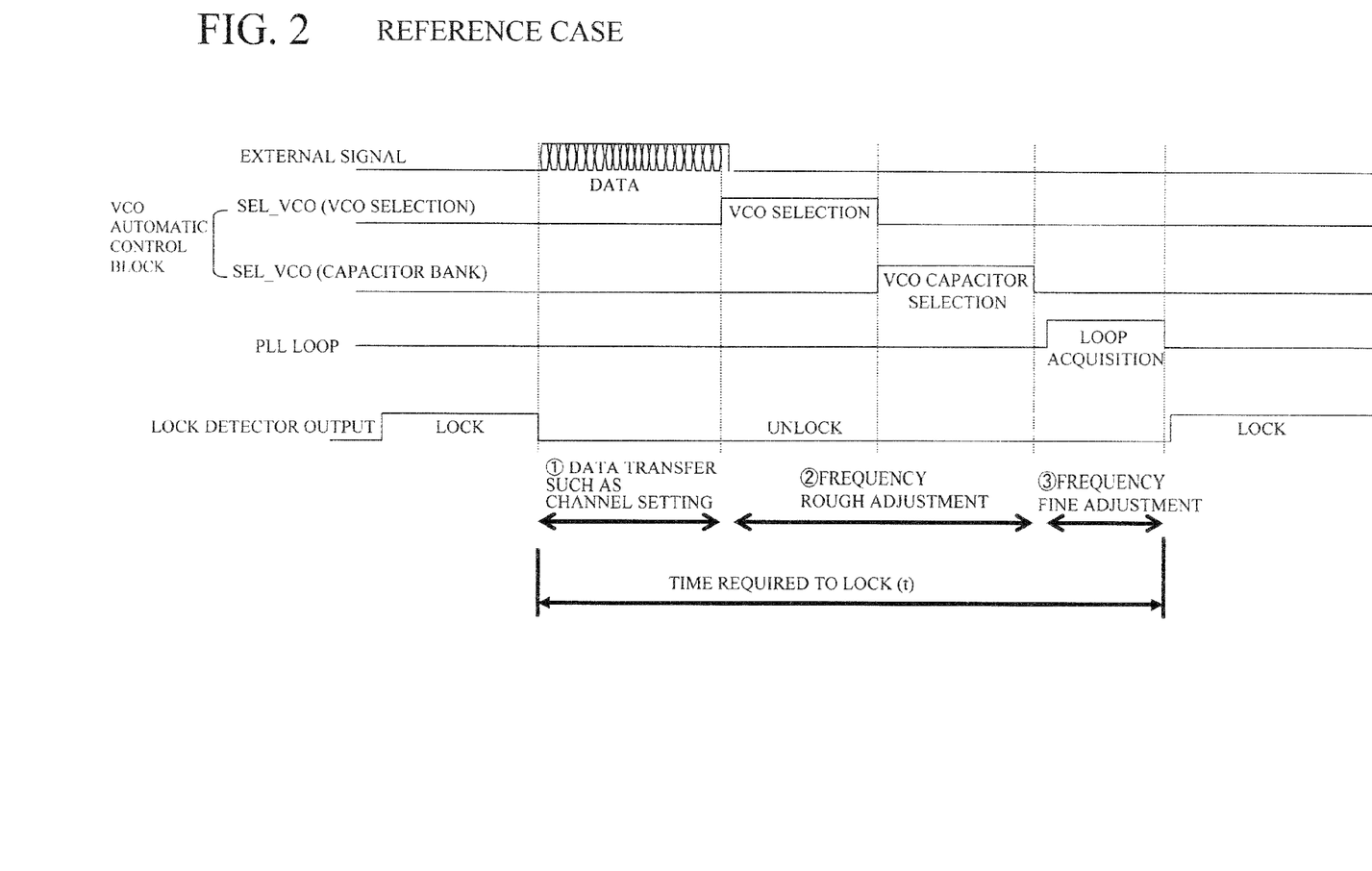
FIG. 2 is a timing chart showing how the frequency synthesizer locks the oscillation frequency.

Next, the procedure in which the VCO automatic control block 7 changes the oscillation frequency and locks it will be described with reference to FIG. 1 and a timing chart shown in FIG. 2. When the oscillation frequency needs to be changed, first, the base band IC 76 sends a command, such as the channel to be changed, for the voltage-controlled oscillator (VCO) group 95 to the VCO automatic control block 7. Based on the command, the VCO automatic control block 7 performs the selection of a voltage-controlled oscillator and the switches that turn on/off the fixed capacitance. Next, the PLL loop is pulled in based on this setting. The phase comparator circuit 2 detects the phase difference between the reference clock 14 and the feedback clock 15, and the low-pass filter 3 changes this phase difference into the control voltage signal 11 for the variable capacitance diode 52, automatically adjusting the capacitance value of the variable capacitance diode. Finally, oscillation is performed at a stable frequency and a locked state is established. Time t required from start of setting channel to oscillating in a stable locked state is 1 to 3 ms.

Figure 3:
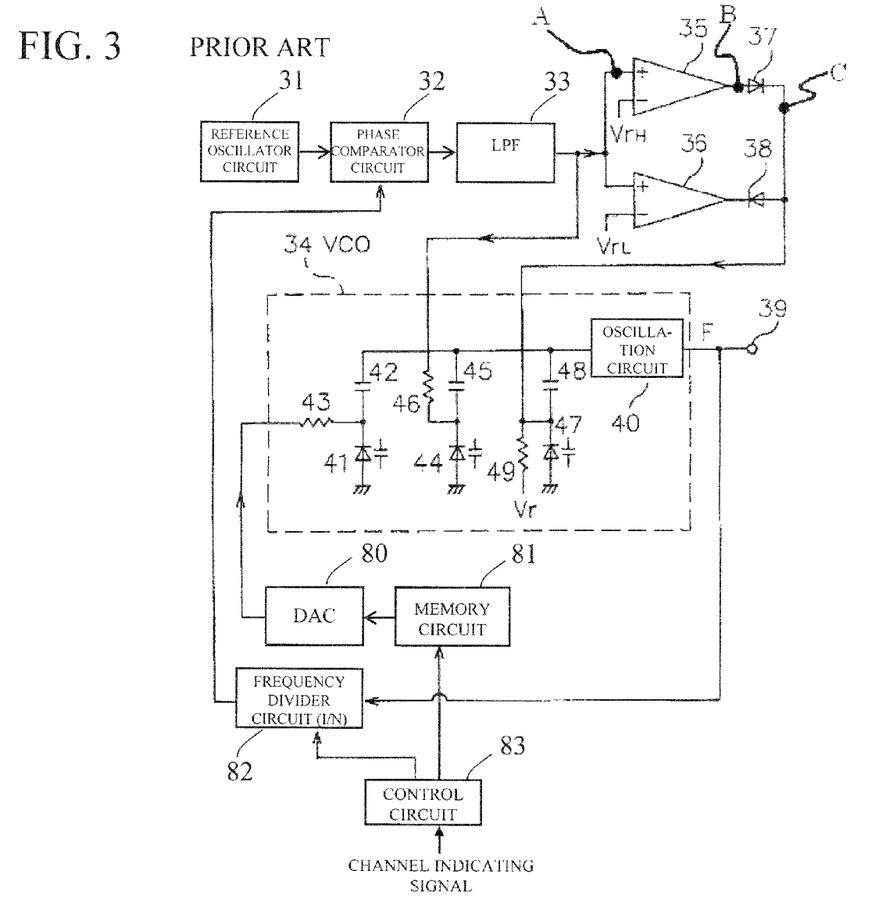
FIG. 3 is a drawing showing the configuration of a conventional frequency synthesizer disclosed in Patent Document 1.

A frequency synthesizer designed to shorten the channel switching time is disclosed in Patent Document 1. The frequency synthesizer disclosed in Patent Document 1 will be described with reference to the drawings. FIG. 3 is a drawing showing the configuration of the frequency synthesizer. This frequency synthesizer comprises three variable capacitance diodes. A DA converter 80 supplies a DC bias voltage to the first variable capacitance diode 41, which is serially connected to a fixed capacitance 42 and determines the approximate capacitance value of a voltage-controlled oscillator 34. The variable capacitance diode 41 provides a similar function to that of the fixed capacitances turned on/off by the switches 58 to 60, shown in FIG. 1. Compared to the conventional example in FIG. 1, the range of capacitance adjustable by the variable capacitance diode 41 is smaller. However, because of this, it is possible to fine-tune the capacitance value even further and the time it takes from the channel switching to the loop acquisition is shortened.

Next, the second variable capacitance diode 44 receives a control voltage signal from a low-pass filter and is serially connected to a fixed capacitance 45. The variable capacitance diode 44 has the same function as the variable capacitance diode 52 serially connected to the fixed capacitance 55 in FIG. 1. The third variable capacitance diode 47 is provided so that it immediately reestablishes a locked state with the help of operational amplifiers 35 and 36 and rectifier diodes 37 and 38 when the lock is released for some reason even though the channel has not been changed.

Further, Patent Document 2 describes a PLL frequency synthesizer in which the time it takes to establish a locked state is shortened by widening the variable range of the oscillation frequency of the voltage-controlled oscillator in an unlocked state and oscillation with low phase noise is realized by narrowing the variable range of the oscillation frequency of the voltage-controlled oscillator after a locked state has been established.

Further, Patent Document 3 discloses a frequency synthesizer in which the DC bias voltage applied to the variable capacitance diode and the temperature compensation digital value are stored in a memory in advance so that a predetermined frequency will oscillate and characteristic changes caused by aged deterioration and the temperature characteristics are compensated.

Further, Patent Document 4 discloses a PLL comprising a voltage-controlled oscillator that switches an oscillation band using a digital signal supplied by a control terminal.
[Patent Document 1]
Japanese Patent Kokai Publication No. JP-A-6-326604
[Patent Document 2]
Japanese Patent Kokai Publication No. JP-P2007-13898A
[Patent Document 3]
Japanese Patent Kokai Publication No. JP-U-6-19327
[Patent Document 4]
Japanese Patent Kokai Publication No. JP-A-10-051304

SUMMARY

The disclosures of the above Patent Documents 1 to 4 are incorporated herein by reference thereto.

An analysis of a related art by the present invention will be given below.

In the conventional technologies described above, there are cases where the lock by the frequency synthesizer is released due to temperature and power supply voltage fluctuations. The temperature and power supply voltage fluctuations cause the DC bias voltage of the variable capacitance diode such as the varactor control voltage to change. If this control voltage exceeds the controllable range (between VtL and VtH), the capacitance of the variable capacitance diode will no longer vary following the change of the control voltage. As a result, the oscillation frequency of the voltage-controlled oscillator will stop following it as well and the phase difference between the reference clock and the feedback clock will not be canceled. The lock detector that detects a lock failure will output a unlock signal and the frequency acquisition operation will be repeated. Once the lock is released, data communication is interrupted. Therefore, an unexpected communication error may occur because of environmental fluctuations such as the temperature and power supply voltage fluctuations. As a result, there is a demand for a frequency synthesizer in which a lock failure does not occur despite environmental fluctuations such as the temperature and power supply voltage fluctuations.

According to an aspect of the present invention, there is provided a frequency synthesizer. The frequency synthesizer includes a phase comparator, a low-pass filter, a voltage-controlled oscillator (VCO), a feedback circuit, a monitor circuit, and a time constant circuit. The phase comparator circuit compares the phases of a reference clock and feedback clock. The low-pass filter smoothes an output signal of the phase comparator circuit and generates a control voltage signal. The voltage-controlled oscillator includes a first variable capacitance diode whose DC bias voltage is controlled by the control voltage signal and a compensation variable capacitance diode. The feedback circuit generates the feedback clock from an output signal of the voltage-controlled oscillator. The monitor circuit monitors the control voltage signal, outputs a control signal for the compensation variable capacitance diode, and changes the voltage levels of the control signal when the voltage level of the control voltage signal is out of a predetermined voltage range. The time constant circuit operates as follows: when the voltage level of the control signal changes, it supplies a DC bias voltage to the compensation variable capacitance diode, slowing down the voltage change so that a locked state that the frequency synthesizer is in is not canceled.

Further, according to another aspect of the present invention, there is provided a frequency synthesizer control method. The method uses a frequency synthesizer including a phase comparator circuit that compares the phases of a reference clock and feedback clock, a low-pass filter that smoothes an output signal of the phase comparator circuit and generates a control voltage signal, a voltage-controlled oscillator that comprises a first variable capacitance diode whose DC bias voltage is controlled by the control voltage signal, a compensation variable capacitance diode, and another capacitance, and a feedback circuit that generates the feedback clock from a clock generated by the voltage-controlled oscillator. The method is performed as follows: in case where the frequency synthesizer is in a locked state, the control voltage signal is out of a predetermined voltage range, and when it is possible to bring the control voltage signal back within the predetermined voltage range via the phase comparator circuit and the low-pass filter circuit a DC bias voltage of the compensation variable capacitance diode is changed, thereby changing an oscillation frequency of the voltage-controlled oscillators changing the DC bias voltage of the compensation variable capacitance diode slowly so that the locked state is not canceled and the control voltage signal is brought back within the predetermined voltage range. On the other hand, when it is impossible to change the DC bias voltage of the compensation variable capacitance diode so as to bring the control voltage signal back within the predetermined voltage range, the capacitance value of the another capacitance, is changed to restart the digital tuning of the voltage-controlled oscillator.

The meritorious effects of the present invention are summarized as follows.

According to the present invention, a frequency synthesizer capable of maintaining a locked state despite environmental changes such as temperature and power supply voltage fluctuations can be obtained.

PREFERRED MODES OF THE INVENTION

Figure 8:
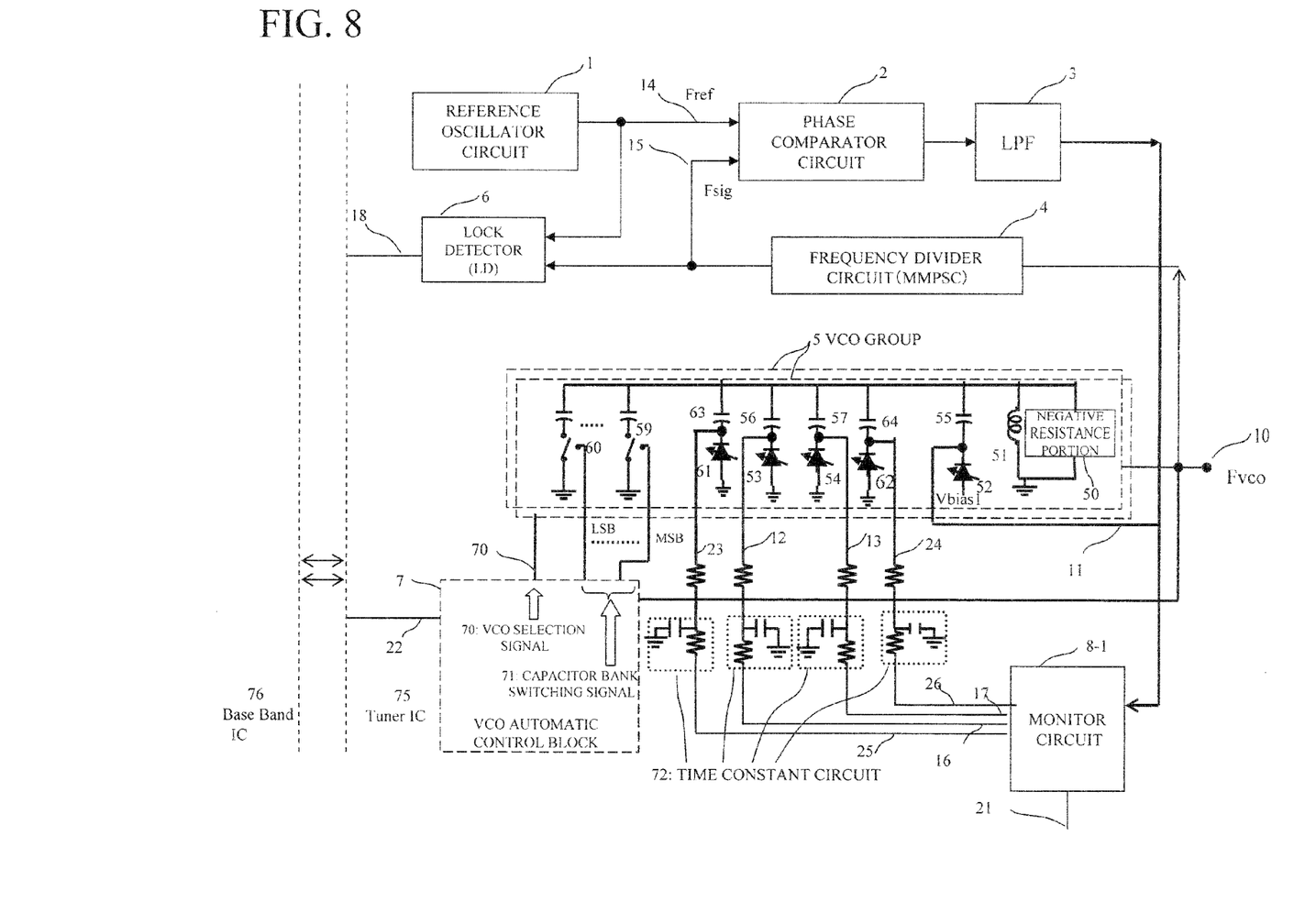
FIG. 8 is a drawing showing the configuration of a frequency synthesizer according to another exemplary embodiment.
Figure 9:
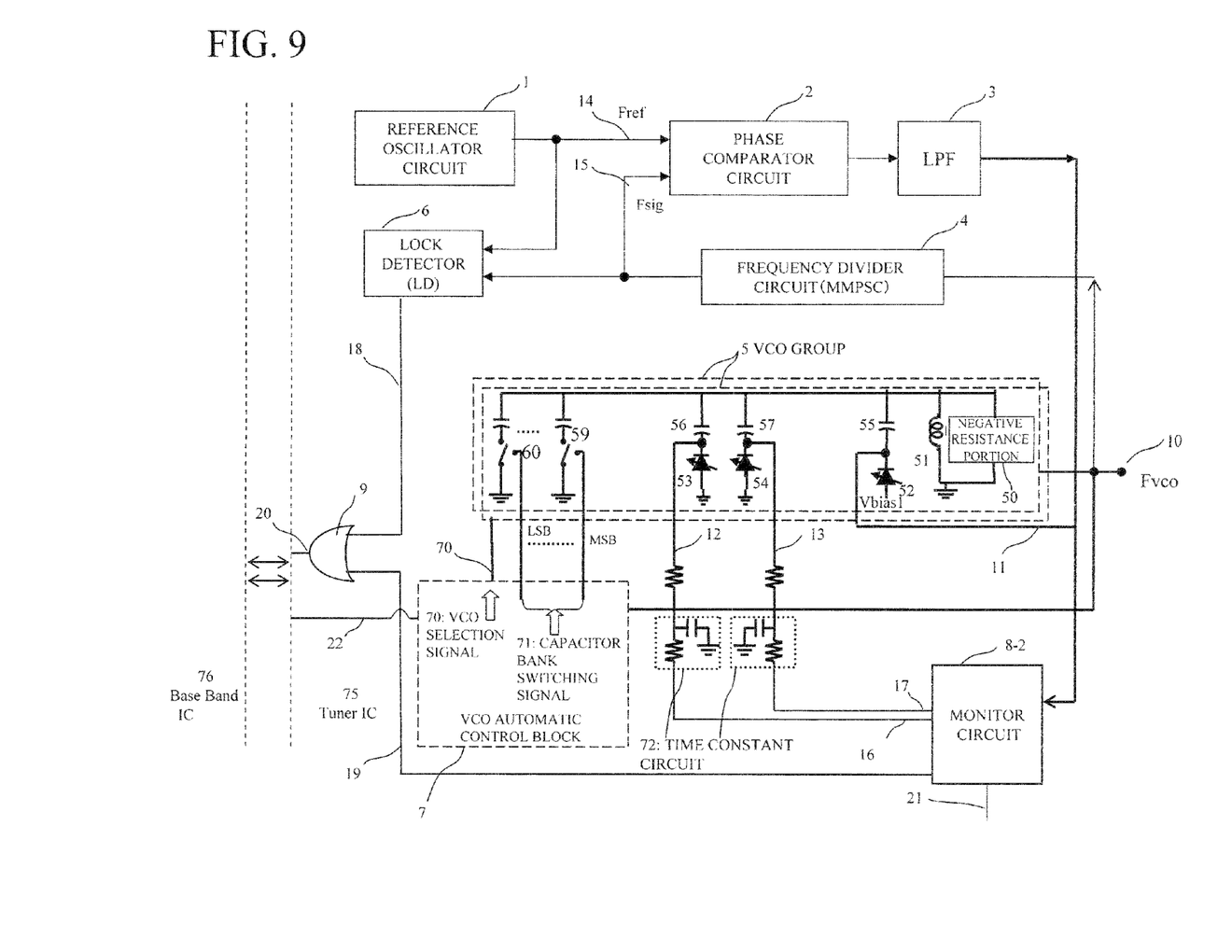
FIG. 9 is a drawing showing the configuration of a frequency synthesizer according to yet another exemplary embodiment.

Modes of the present invention will be described with reference to the drawings. For instance, as shown in FIGS. 5, 8, and 9, a frequency synthesizer according to a mode of the present invention includes a phase comparator circuit (2) that compares the phases of a reference clock (14) and a feedback clock (15); a low-pass filter (3) that smoothes an output signal of the phase comparator circuit and generates a control voltage signal (11); a voltage-controlled oscillator (of a voltage-controlled oscillator group 5) that includes a first variable capacitance diode (52) whose DC bias voltage is controlled by the control voltage signal and compensation variable capacitance diodes (53, 54, 61, and 62); a feedback circuit (4) that generates the feedback clock from an output signal (10) of the voltage-controlled oscillator; a monitor circuit (8, 81, and 82) that monitors the control voltage signal, outputs control signals (16, 17, 25, and 26) for the compensation variable capacitance diodes, and changes the voltage levels of the control signals when the voltage level of the control voltage signal is out of a predetermined voltage range; and a time constant circuit (72) that supplies a DC bias voltage to the compensation variable capacitance diodes, slowing down the voltage changes so that the lock of the frequency synthesizer is not released, when the voltage levels of the control signals change.

Figure 6:
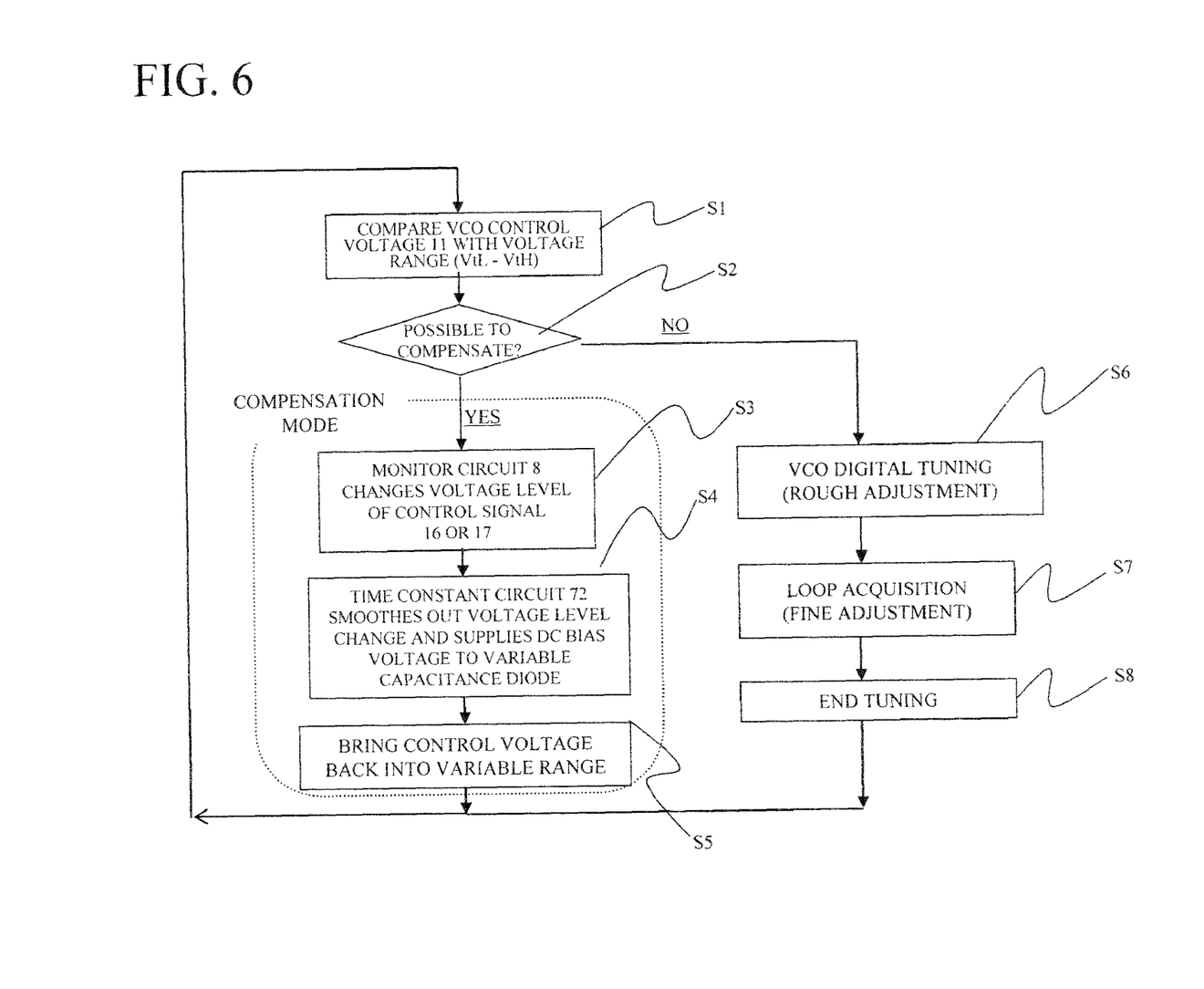
FIG. 6 is a flowchart showing a frequency synthesizer control method according to an exemplary embodiment.

Further, as shown in FIG. 6, in a frequency synthesizer control method according to a mode of the present invention, a frequency synthesizer includes a phase comparator circuit that compares the phases of a reference clock and a feedback clock, a low-pass filter that smoothes an output signal of the phase comparator circuit and generates a control voltage signal, a voltage-controlled oscillator that comprises a first variable capacitance diode whose DC bias voltage is controlled by the control voltage signal, a compensation variable capacitance diode, and another capacitance, and a feedback circuit that generates the feedback clock from a clock generated by the voltage-controlled oscillator; when the frequency synthesizer is in a locked state, the control voltage signal is out of a predetermined voltage range, and it is possible to change the DC bias voltage of the compensation variable capacitance diode thereby changing the oscillation frequency of the voltage-controlled oscillator and further bringing the control voltage signal back within the predetermined voltage range via the phase comparator circuit and the low-pass filter circuit (YES in step S2), the locked state is maintained by changing the DC bias voltage of the compensation variable capacitance diode slowly so that the locked state is not canceled and the control voltage signal is brought back within the predetermined voltage range (step S5); and when it is impossible to change the DC bias voltage of the compensation variable capacitance diode so as to bring the control voltage signal back within the predetermined voltage range (NO in the step S2), the capacitance value of the other capacitance is switched and the operation is restarted from the digital tuning of the voltage-controlled oscillator (steps S6 to S8). The present invention will be further described in detail using exemplary embodiments with reference to the drawings.

Exemplary Embodiment 1

Figure 5:
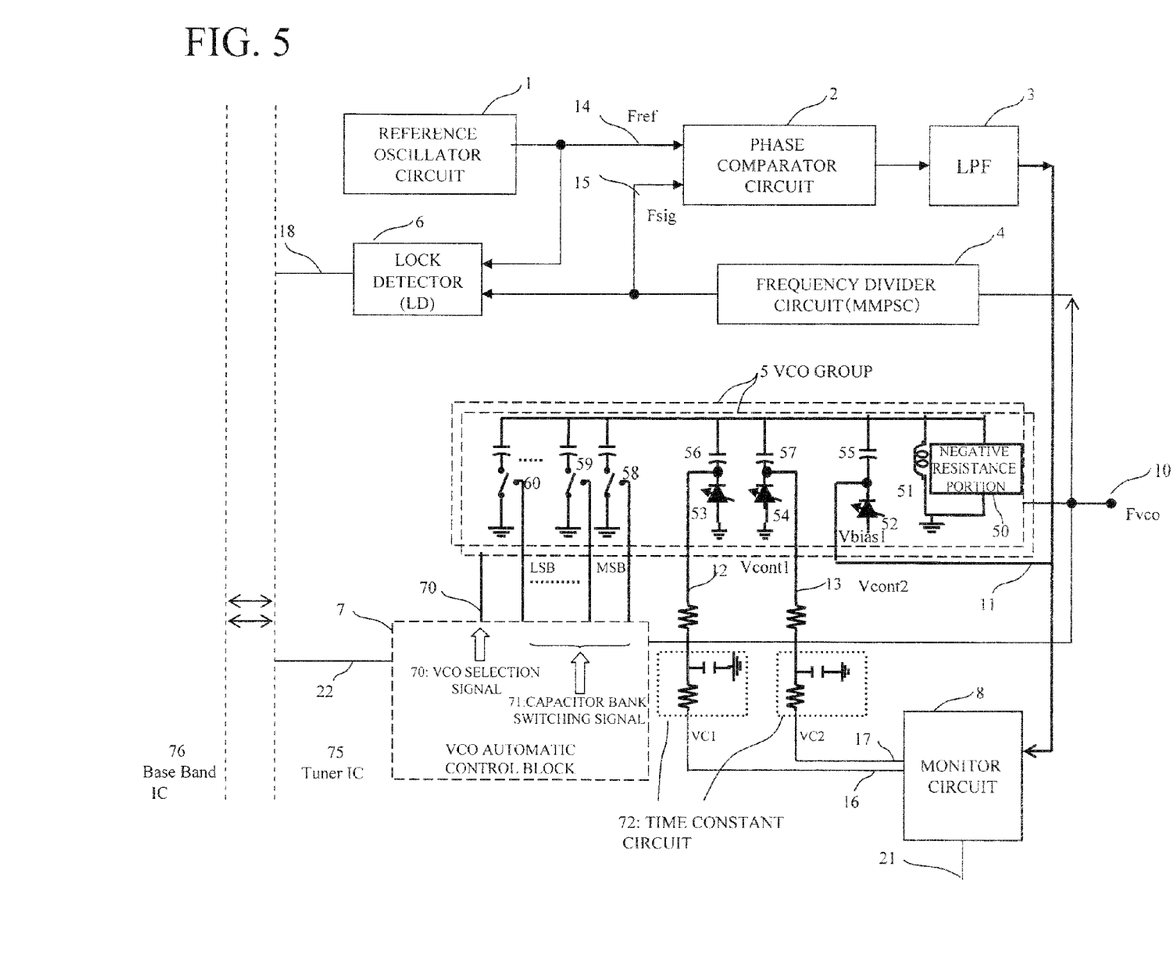
FIG. 5 is a drawing showing the configuration of a frequency synthesizer according to an exemplary embodiment.

FIG. 5 is a block diagram showing the configuration of a frequency synthesizer according to a first exemplary embodiment Portions essentially identical to corresponding portions in the conventional example shown in FIG. 1 have the same numbers and the explanations of them will be omitted. The exemplary embodiment in FIG. 5 comprises the monitor circuit 8 that monitors the voltage level of the control voltage signal 11 and outputs the control signals 16 and 17, the time constant circuit 72 that weakens the control signals 16 and 17 and that generates compensation DC bias signals 12 and 13, and the compensation variable capacitance diodes 53 and 54 that receive the compensation DC bias signals 12 and 13 as DC bias voltages and that compensate the capacitance of a voltage-controlled oscillator of the voltage-controlled oscillator group 5. Further, a reset signal 21 is fed to the monitor circuit 8.

The time constant circuit 72 is constituted by resistances and capacitances. The resistances are respectively provided between output terminals of the monitor circuit 8, which output the control signals 16 and 17, and each cathode of the compensation variable capacitance diodes 53 and 54. The capacitances are respectively provided between each cathode of the compensation variable capacitance diodes 53 and 54 and the ground. The values of the resistances and the capacitances of the time constant circuit 72 have a sufficiently large time constant so that the feedback loop system of the frequency synthesizer sufficiently follows the variation in capacitance caused by the variation in the DC bias voltage of the compensation variable capacitance diodes 53 and 54 and that the voltage-controlled oscillator can maintain a constant frequency. Further, as shown in FIG. 5, more resistances may be provided between the capacitances and each cathode of the compensation variable capacitance diodes 53 and 54.

Further, as a cathode of the variable capacitance diode 52 is serially connected to the fixed capacitance 55 and is connected to the inductor 51 and the negative resistance portion 50 in parallel, the cathodes of the compensation variable capacitance diodes 53 and 54 are serially connected to fixed capacitances 56 and 57 respectively and connected to each other in parallel. Since the variable capacitance diodes 52, 53, and 54 are serially connected to the fixed capacitances 55, 56, and 57 respectively and are connected to the inductor 51 and the negative resistance portion 50 in parallel, different DC bias voltages can be separately and independently applied to the variable capacitance diodes 52, 53, and 54. However, since the capacitance values of the fixed capacitances 55, 56, and 57 are sufficiently larger than those of the variable capacitance diodes 52, 53, and 54 respectively, these variable capacitance diodes 52, 53, and 54 essentially function as capacitances connected to the inductor 51 and the negative resistance portion 50 in parallel in terms of alternating current. Therefore, if the DC bias voltage of any of the variable capacitance diodes 52, 53, and 54 changes, the capacitance value of this voltage-controlled oscillator will change and so will the oscillation frequency.

Otherwise, the present exemplary embodiment is configured similarly to the conventional example in FIG. 1. Further, the voltage-controlled oscillator group 5 includes a plurality of voltage-controlled oscillators having different oscillation frequency bands, and each voltage-controlled oscillator included in the voltage-controlled oscillator group 5 is configured as described above. Furthermore, only one voltage-controlled oscillator may be provided in cases where it is not necessary to provide a plurality of voltage-controlled oscillators.

Figure 7A:
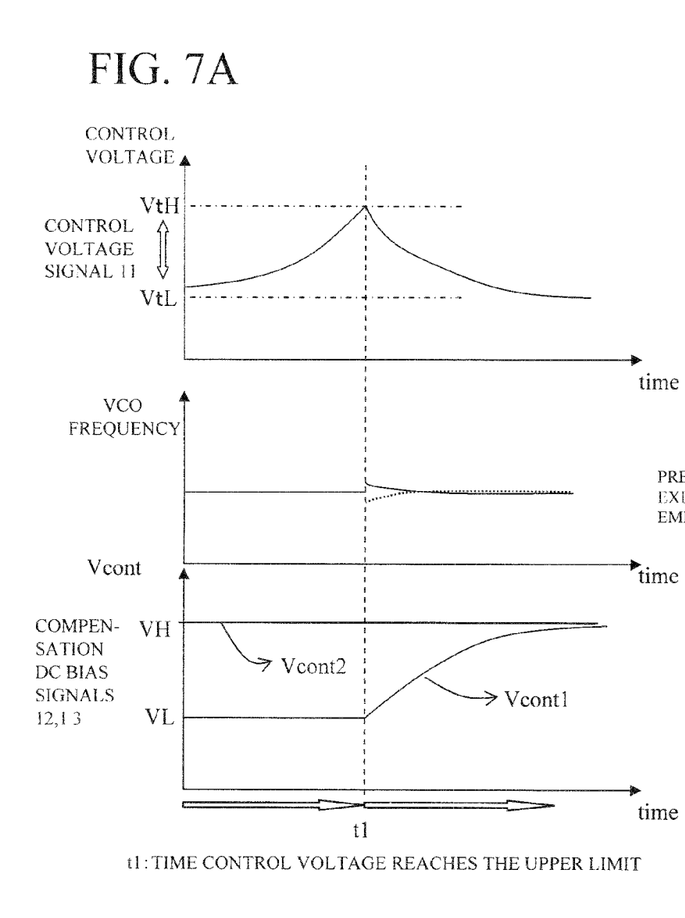
FIGS. 7A and 7B are waveform diagrams of a main portion of an exemplary embodiment.

Next, the operation of the frequency synthesizer shown in FIG. 5 will be described with reference to FIGS. 7A and 7B, which are waveform diagrams of its main portion. When the frequency synthesizer is not in a locked state, i.e., it is in an unlocked state, the base band IC 76 feeds the reset signal 21 to the monitor circuit 8, resetting the monitor circuit 8 to an initial state In the initial state, the control signal 16 is reset to a low level and the control signal 17 to a high level. As a result, as shown in FIG. 7A, the compensation DC bias signal 12 is initialized to a low level and the compensation DC bias signal 13 to a high level.

Then, the frequency synthesizer pulls the loop into a predetermined frequency and gets into a locked state. In the locked state, the oscillation frequency of the voltage-controlled oscillator group 5 becomes constant and stable. Further, in this state, the lock detector 6 outputs the lock detection signal 18 to the base band IC 76, and the base band IC 76 cancels the reset signal 21 for the monitor circuit 8 upon receiving the lock detection signal 18.

However, if the control voltage signal 11 outputted from the low-pass filter 3 stays within a range between VtL and VtH, the control signals 16 and 17 outputted from the monitor circuit 8 will continue to be in the same state as when the reset signal 21 is supplied. In this exemplary embodiment shown in FIG. 7A, as the environment such as the ambient temperature and the power supply voltage gradually changes, the control voltage signal 11 gradually rises and it reaches the upper limit value VtH at timing t1. Upon detecting that the control voltage signal 11 has exceeded the upper limit VtH, the monitor circuit 8 raises the control signal 16 from the low level to a high level. However, even when the control signal 16 rises, the DC bias control voltage of the compensation variable capacitance diode 53 does not change immediately since there is the time constant circuit 72 between the monitor circuit 8 and the compensation variable capacitance diode 53. As a result, the entire capacitance of the voltage-controlled oscillator group 5 as an oscillator remain the same and so does the oscillation frequency of the voltage-controlled oscillator group 5. Therefore, the locked state is maintained even when the monitor circuit 8 raises the control signal 16.

However, as time elapses, the DC bias control voltage (Vcont 1) of the compensation variable capacitance diode 53 gradually increases via the time constant circuit 72. Along with this increase in the DC bias control voltage (Vcont1), the capacitance value of the compensation variable capacitance diode 53 changes. Because of this, the capacitance of the entire voltage-controlled oscillator changes, and gradually the oscillation frequency of the voltage-controlled oscillator also tries to change. The phase comparator circuit 2 detects this change of the oscillation frequency of the voltage-controlled oscillator and tries to lower the control voltage signal 11 via the low-pass filter 3. Since the entire system works so as to maintain the original oscillation frequency, the oscillation frequency is maintained and the locked state continues. In other words, the time constant circuit 72 functions to smooth the change of the control signal voltage level so that the change does not turn into a large fluctuation of the oscillation frequency, maintaining the locked state.

Figure 7B:
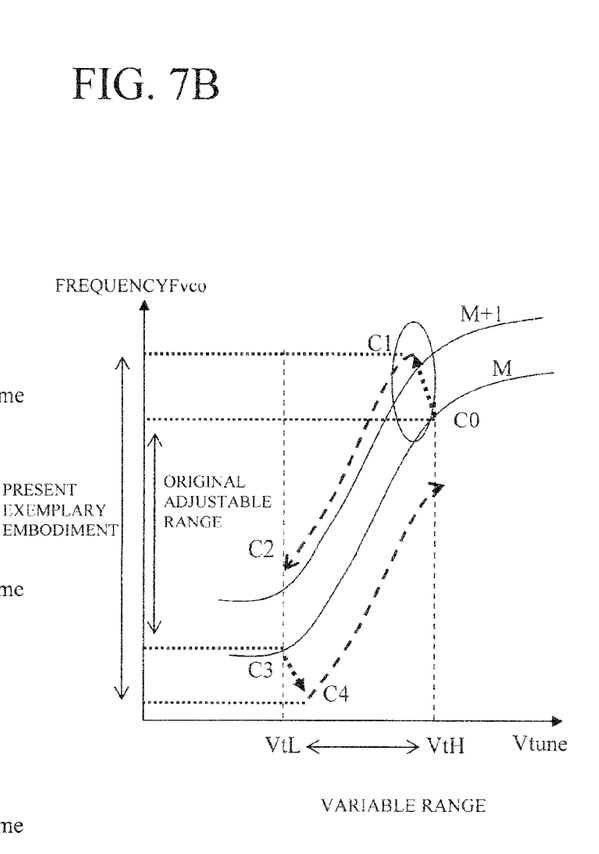

With reference to FIG. 7B, the upper limit value VtH and the lower limit value VtL are determined as follows. A curved line M in FIG. 7B indicates the relationship between the control voltage signal 11 of the voltage-controlled oscillator in the initial state and the oscillation frequency Fvco. The variable capacitance diode 52 shows nearly linear characteristics between the upper limit value VtH and the lower limit value VtL of the control voltage signal 11, and the oscillation frequency can vary following the voltage change of the control voltage signal 11, as long as the control voltage signal 11 remains within the range between the upper limit value VtH and the lower limit value VtL. However, when the control voltage signal 11 goes out of the range between the upper limit value VtH and the lower limit value VtL, it is difficult to change the oscillation frequency following the voltage change of the control voltage signal 11. In such a case, upon detecting that the control voltage signal 11 has exceeded VtH, the monitor circuit 8 changes the DC bias voltages of the compensation variable capacitance diodes 53 and 54, and shifts the voltage-to-oscillation frequency characteristics of the voltage-controlled oscillator group 5 from characteristics of C0 to C3 to characteristics of C1 to C2. At this time, since the system as a whole tries to maintain the original oscillation frequency, the control voltage signal 11 falls.

If the control voltage signal 11 exceeds the upper limit value VtH again after this, the control voltage signal 11 can no longer be brought back into the range between the lower limit value VtL and the upper limit value VtH by having the monitor circuit 8 control the DC bias voltages of the compensation variable capacitance diodes 53 and 54. In this case, the lock detector 6 outputs the unlock signal, VCO automatic control block 7 outputs a VCO selection signal 70 and a capacitor bank switching signal 71, and the operation is restarted from the digital tuning of the VCO.

Similarly, when the control voltage signal 11 falls below the lower limit voltage VtL, the monitor circuit 8 lowers the control signal 17 from the high level to a low level. Because of this, the DC bias voltage (Vcont2) of the compensation variable capacitance diode 54 decreases and the control voltage signal-11-to-oscillation frequency characteristics of the entire voltage-controlled oscillator 5 changes from C3 to C4 shown in FIG. 7B. However, since the change of the DC bias voltage for the compensation variable capacitance diode 54 is slow due to the effects of the time constant circuit 72, the oscillation frequency maintains a stable state. Then, if the control voltage signal 11 falls below the lower limit voltage VtL again, the operation will be restarted from the digital tuning of the VCO.

In other words, whether the control voltage signal 11 first exceeds the upper limit voltage VtH or it first falls below the lower limit voltage VtL, in either case, the voltage-controlled oscillator stably maintains a nearly fixed oscillation frequency with the help of the monitor circuit 8, the time constant circuit 72, and the compensation variable capacitance diodes 53 and 54, and the control voltage signal 11 is brought back into a voltage between the lower limit voltage VtL and the upper limit voltage VtH while the locked state is maintained. Therefore, even when there are environmental changes such as slow fluctuations of the ambient temperature and the power supply voltage, the locked state is not affected and is maintained.

FIG. 6 is a flowchart showing the procedure performed in the first exemplary embodiment. First, when the frequency synthesizer is in a locked state, the monitor circuit 8 compares the control voltage signal 11 with the lower limit value VtL and the upper limit value VtH of the voltage range (step S1). Next, when the control voltage signal 11 is out of the predetermined voltage range and it is possible to bring the control voltage signal 11 back into the predetermined voltage range using the monitor circuit 8, the time constant circuit 72, and the compensation variable capacitance diodes, the "bring-back" processing is performed (YES in the step S2). In this processing, the monitor circuit 8 changes the voltage level of the control signal 16 or 17 (step S3), the time constant circuit 72 smoothes out the voltage level change of the control signal 16 or 17 and supplies a DC bias voltage to the compensation variable capacitance diode 53 or 54 (step S4), and the control voltage signal 11 is slowly brought back into the predetermined voltage range (the step S5).

On the other hand, when the control voltage signal 11 is out of the predetermined voltage range and it is not possible to bring the control voltage signal 11 back into the predetermined voltage range using the monitor circuit 8, the time constant circuit 72, and the compensation variable capacitance diodes (NO in the step S2), the lock detector 6 outputs the unlock signal, the VCO automatic control block 7 outputs the VCO selection signal 70 and the capacitor bank switching signal 71, and the operation is restarted from a rough adjustment of the digital tuning of the VCO (the step S6). After the selection of a VCO and capacitor bank is completed, the frequency synthesizer starts to perform fine-adjustment for frequency acquisition (the step S7). After the frequency acquisition is completed, the voltage-controlled oscillator starts to stably oscillate at a fixed frequency, the lock detector 6 outputs the lock detection signal 18 upon detecting that the frequency synthesizer is in a locked state, and the tuning operation is terminated (the step S8). In either case the step S5 or S8, the operation returns to the step S1 and continues.

Exemplary Embodiment 2

Next, a second exemplary embodiment will be described. FIG. 8 is a drawing showing the configuration of a frequency synthesizer according to the second exemplary embodiment. The second exemplary embodiment will be described with reference to the drawing. In the second exemplary embodiment, the monitor circuit 8 of the first exemplary embodiment is replaced by a monitor circuit 8-1, which outputs not only the control signals 16 and 17, but also control signals 25 and 26. Further, the time constant circuit 72 is provided not only for the control signals 16 and 17, but also for the control signals 25 and 26.

Next, the operation of the second exemplary embodiment will be described. As in the first exemplary embodiment, the monitor circuit 8-1 is reset by the reset signal 21 when the frequency synthesizer is in an unlocked state. By the reset signal 21, the control signals 16 and 25 are reset to a low level and the control signals 17 and 26 to a high level. Then the frequency synthesizer enters into a locked state. Further, if the control voltage signal 11 exceeds the upper limit value VtH due to environmental changes such as temperature or power supply voltage fluctuations, the control signal 16 changes from the low level to a high level This level change of the control signal 16 is delayed by the time constant circuit 72 so that the oscillation frequency of the voltage-controlled oscillator will not fluctuate greatly and is supplied as the DC bias voltage of the compensation variable capacitance diode 53. As a result, the voltage value of the control voltage signal 11 settles at a fixed value between the upper limit value VtH and the lower limit value VtL. At this time, as far as the control signals outputted from the monitor circuit 8-1 are concerned, the control signal 25 is at the low level, and the control signals 16, 17, and 26 are at the high level.

If the control voltage signal 11 exceeds the upper limit value VtH after this again, this time the control signal 25 changes from the low level to a high level. Then, after a predetermined transitional time period has elapsed, the voltage value of the control voltage signal 11 again settles at a fixed value between the upper limit value VtH and the lower limit value VtL. At this time, all the control signals outputted from the monitor circuit 8-1 (16, 17, 25, and 26) are at the high level.

After this, if the control voltage signal 11 exceeds the upper limit value VtH yet again, since the monitor circuit 8-1 is not able to perform the compensation operation anymore, the frequency synthesizer goes out of the locked state and the lock detector detects an unlocked state. Then, the VCO automatic control block 7 outputs the capacitor bank switching signal 71, switches the switches 59 and 60, changes the fixed capacitances, and restart the loop acquisition operation.

On the other hand, if the control voltage signal 11 falls below the lower limit value VtL, after the frequency synthesizer has entered into the locked state, the control signal 17 changes from the high level to a low level, and after a predetermined time period has elapsed, the voltage value of the control voltage signal 11 settles at a fixed value between the upper limit value VtH and the lower limit value VtL. At this time, as far as the control signals outputted from the monitor circuit 8-1 are concerned, the control signals 25, 16, and 17 are at a low level, and the control signal 26 are at the high level.

If the control voltage signal 11 falls below the lower limit value VtL, after this again, this time the control signal 26 changes from the high level to a low level, and after a predetermined time period has elapsed, the voltage value of the control voltage signal 11 settles at a fixed value between the upper limit value VtH and the lower limit value VtL. At this time, all the control signals outputted from the monitor circuit 8-1 (16, 17, 25, and 26) are at the low level.

After this, if the control voltage signal 11 falls below the lower limit value VtL yet again, since the monitor circuit 8-1 is not able to perform the compensation operation anymore, the frequency synthesizer goes out of the locked state and the VCO automatic control block 7 restart the digital tuning operation from the selection of a voltage-controlled oscillator and capacitance value of the fixed capacitances.

Figure 10:
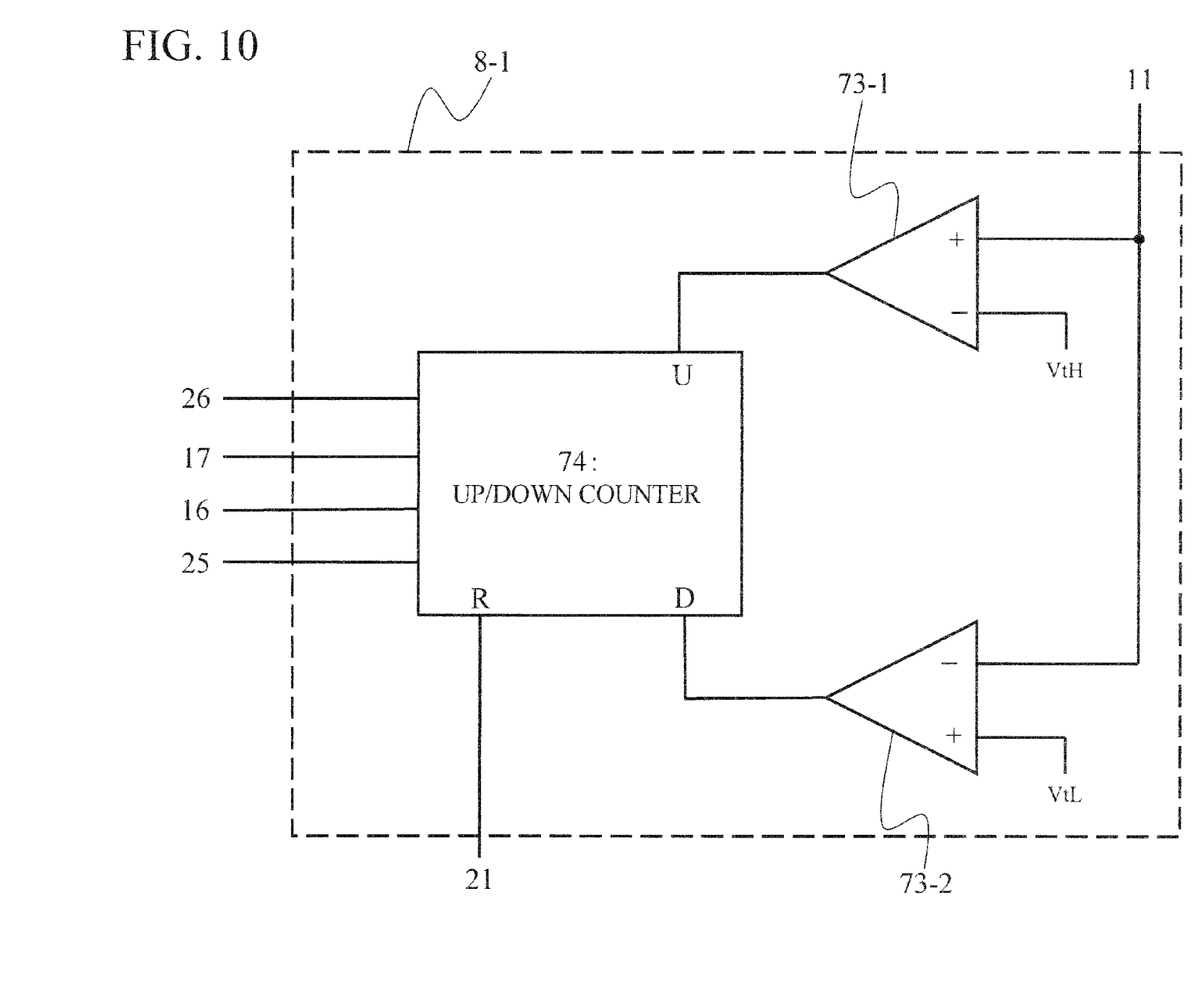
FIG. 10 is a drawing showing an example of an internal circuit of the monitor circuit 8-1 shown in FIG. 8.

Next, the monitor circuit 8-1 of the second exemplary embodiment will be described in detail using FIG. 10 showing the configuration of its internal circuit. The monitor circuit 8-1 comprises a voltage comparator 73-1 that compares the control voltage signal 11 with the upper limit value VtH, a voltage comparator 73-2 that compares the control voltage signal 11 with the lower limit value VtL, and an up/down counter 74 that counts the number obtained by subtracting the number of times that the control voltage signal 11 falls below the lower limit value from the number of times that it exceeds the upper limit value. The control signals 16, 17, 25, and 26 are controlled according to the count value of the up/down counter 74. The control signal 25 becomes high level when the count value of the up/down counter 74 is 2 or greater and low level when it is 1 or smaller. The control signal 16 becomes high level when the count value of the up/down counter 74 is 1 or greater and low level when it is 0 or smaller. Similarly, the control signal 17 becomes high level when the count value is 0 or greater and low level when it is −1 or smaller, and the control signal 26 becomes high level when the count value is −1 or greater, and low level when it is −2 or smaller. Further, the up/down counter 74 is reset to an initial value 0 by the reset signal 21. By configuring the monitor circuit 8-1 as described above, when the difference between the number of times that the control voltage signal 11 exceeds the upper limit value and the number of times that it falls below the lower limit value is not greater than 2, the locked state is maintained and the voltage level of the control voltage signal 11 can be adjusted while keeping the oscillation frequency at a fixed value by controlling the output level of the control signals 16, 17, 25, and 26 every time the control voltage signal 11 goes out of the upper limit value or the lower limit value.

When the control voltage signal 11 goes out of the range between the lower limit value VtL and the upper limit value VtH, the compensation operation, in which the control voltage signal 11 is brought back into the range between the lower limit value VtL and the upper limit value VtH while a locked state is maintained, can be performed only once in the first exemplary embodiment, however, in the second exemplary embodiment, this compensation operation can be performed a few times and the locked state can be maintained against large environmental changes such as fluctuations of the ambient temperature and power supply voltage. It should be noted that the range of the compensation operation will further widen in the second exemplary embodiment if the number of the control signals outputted from the monitor circuit and the number of compensation variable capacitance diodes are increased.

Exemplary Embodiment 3

In the present exemplary embodiment described above, since the voltage of the control voltage signal can be changed while the oscillation frequency of the voltage-controlled oscillator is maintained, the lock detector 6 basically never detects unlocked state. However, in order to prevent the frequency synthesizer from erroneously entering into an unlocked state due to, for instance, the circuit configuration of the lock detector 6, it may be configured so that the lock detector 6 does not erroneously detect an unlock signal while the voltage level of the control voltage signal is being changed using the monitor circuit, the time constant circuit, and the compensation variable capacitance diodes of the exemplary embodiment while the oscillation frequency of the voltage-controlled oscillator is maintained. A third exemplary embodiment is such an example.

FIG. 9 is a drawing showing the configuration of a frequency synthesizer according to the third exemplary embodiment. Compared with the first exemplary embodiment shown in FIG. 5, an OR gate 9 that receives the lock detection signal 18 outputted from the lock detector 6 and an unlock inhibition signal 19 outputted from a monitor circuit 8-2 and that outputs a locked state notification signal 20 is added in FIG. 9. Further, the monitor circuit 8-2 temporarily sets the unlock inhibition signal 19 at a high level when adjusting the voltage level of the control voltage signal 11 by changing the logic level of the control signal 16 or 17. At any other time, the unlock inhibition signal 19 is at a low level. The OR gate 9 outputs the locked state notification signal 20 at a high level while the unlock inhibition signal is at a high level, regardless of the state that the lock detector 6 is in. Therefore, during the adjustment of the voltage level of the control voltage signal 11, the OR gate 9 never erroneously outputs the locked state notification signal 20. On the other hand, when the monitor circuit 8-2 is not adjusting the voltage level of the control voltage signal 11, the unlock signal (the lock detection signal 18 at a low level) detected by the lock detector 6 is notified to the base band IC 76 as the locked state notification signal 20 at a low level, without being changed.

Comparison Example

Figure 4:
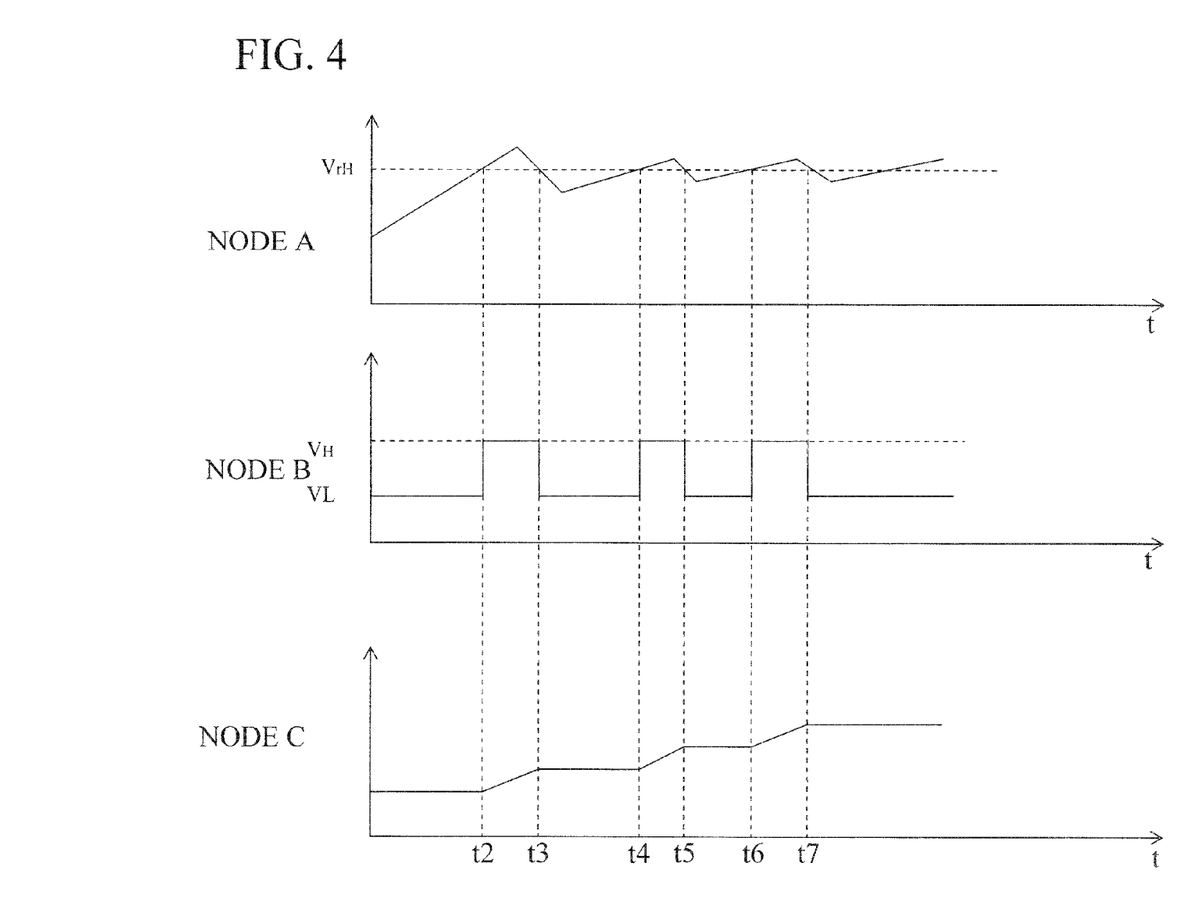
FIG. 4 is a timing chart of the frequency synthesizer shown in FIG. 3, based on an analysis by the inventor.

Further, as a reference, an analysis by the inventor on how the operation of the aforementioned Patent Document 1 is affected by environmental changes such as temperature and power supply voltage fluctuations will be given using FIG. 3 showing its configuration and a timing chart in FIG. 4. In Patent Document 1, while the frequency synthesizer is in a locked state, if the control voltage (indicated by line A) of LPF 33 exceeds the upper limit voltage VtH (at timing t2) due to environmental changes, the operational amplifier 35 outputs a high level (indicated by line B). Then current flows through the rectifier diode 37 and the DC bias voltage (indicated by line C) of the variable capacitance diode quickly increases. At this time, unlike each exemplary embodiment, since only the rectifier diode 37 is provided after the operational amplifier 35 without the time constant circuit that smoothes the waveform the oscillation frequency of an oscillation circuit 40 changes relatively drastically due to the fact that the variable capacitance diode 47 is charged by the operational amplifier 35, and the locked state is canceled.

Next, when a phase difference occurs between the reference clock and the feedback clock as the oscillation frequency of the oscillation circuit 40 changes, the potential indicated by the line A decreases. Once it falls below VtH, the output of the operational amplifier 35 is inverted again and the charging indicated by the line C stops (timing t3). Then, when the potential indicated by the line A increases again and exceeds VtH, the output of the operational amplifier 35 is inverted again, and the charging indicated by the line C restarts (timing t4). As described, as the environment changes, the DC bias voltage (the line C) of the variable capacitance diode increases (or decreases) in steps. It is likely that the lock is released every time this step-like change occurs.

Further, in a locked state, the voltage indicated by the line C is floating in terms of direct current since both the diodes 37 and 38 are turned off. This may make the frequency synthesizer more susceptible to noise and phase noise characteristics may deteriorate.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A frequency synthesizer, comprising:
   a phase comparator circuit that compares the phases of a reference clock and feedback clock;
   a low-pass filter that smoothes an output signal of said phase comparator circuit and generates a control voltage signal;
   a voltage-controlled oscillator that includes a first variable capacitance diode whose DC bias voltage is controlled by said control voltage signal and a compensation variable capacitance diode;
   a feedback circuit that generates said feedback clock from an output signal of said voltage-controlled oscillator;
   a monitor circuit that monitors said control voltage signal, outputs a control signal for said compensation variable capacitance diode, and changes the voltage levels of said control signal upon the voltage level of said control voltage signal being out of a predetermined voltage range;
   a time constant circuit that, upon the voltage level of said control signal changes, supplies a DC bias voltage to said compensation variable capacitance diode, slowing down the voltage change so that a locked state that said frequency synthesizer is in not being canceled; and
   a lock detection circuit and a lock cancellation signal output inhibiting circuit that inhibits said lock detection circuit from outputting a lock cancellation signal upon said monitor circuit detecting that said control voltage signal has gone out of said predetermined voltage range.

2. The frequency synthesizer as defined in claim 1, wherein said monitor circuit switches said control signal for said compensation variable capacitance from a high level to a low level upon the voltage level of said control voltage signal exceeding said predetermined voltage range;
   said monitor circuit switches said control signal for said compensation variable capacitance diode from a low level to a high level upon the voltage level of said control voltage signal falling below said predetermined voltage range; and
   said time constant circuit supplies a DC bias voltage to said compensation variable capacitance diode, smoothing out said switch from a high level to a low level or said switch from a low level to a high level into a slow voltage change so that said locked state is not canceled.

3. The frequency synthesizer as defined in claim 1, wherein said monitor circuit fixes the voltage level of said control signal regardless of the voltage level of said control voltage signal upon said frequency synthesizer being in an unlocked state.

4. The frequency synthesizer as defined in claim 1, wherein said voltage-controlled oscillator further comprises at least one fixed capacitance serially and respectively connected to a switch, and said frequency synthesizer changes the capacitance value of said voltage-controlled oscillator by changing the connection of said switch upon said monitor circuit detecting that said control voltage signal has gone out of said predetermined voltage range and it is not possible to bring back said control voltage signal into said predetermined voltage range by changing the DC bias voltage of said compensation variable capacitance diode.

5. The frequency synthesizer as defined in claim 4, wherein said first variable capacitance diode, said compensation variable capacitance diode, and said at least one fixed capacitance serially connected to said switch are substantially connected in parallel.

6. The frequency synthesizer as defined in claim 1, wherein said monitor circuit comprises a first voltage comparator that compares said control voltage signal with an upper limit voltage of said predetermined voltage range, a second voltage comparator that compares said control voltage signal with an lower limit voltage of said predetermined voltage range, and an up/down counter having an output signal of either said first or said second voltage comparator connected to its count-up signal input terminal and an output signal of the other voltage comparator connected to its countdown signal input terminal and reset upon said frequency synthesizer being in an unlocked state; and said monitor circuit changes the voltage level of a control signal for said compensation variable capacitance diode according to a count value of said up/down counter.

7. A frequency synthesizer, comprising:
a phase comparator circuit that compares the phases of a reference clock and feedback clock;
a low-pass filter that smoothes an output signal of said phase comparator circuit and generates a control voltage signal;
a voltage-controlled oscillator that includes a first variable capacitance diode whose DC bias voltage is controlled by said control voltage signal and a plurality of compensation variable capacitance diodes;
a feedback circuit that generates said feedback clock from an output signal of said voltage-controlled oscillator;
a monitor circuit that monitors said control voltage signal, outputs a plurality of control signals for said plurality of compensation variable capacitance diodes, and changes the voltage levels of at least one of said plurality of control signals upon the voltage level of said control voltage signal being out of a predetermined voltage range;
a plurality of time constant circuits that, upon the voltage level of any of said plurality of control signals change, supply a DC bias voltage to corresponding one of said plurality of compensation variable capacitance diodes, slowing down the voltage change so that a locked state that said frequency synthesizer is in not being canceled; and
a lock detection circuit and a lock cancellation signal output inhibiting circuit that inhibits said lock detection circuit from outputting a lock cancellation signal upon said monitor circuit detecting that said control voltage signal has gone out of said predetermined voltage range.

8. The frequency synthesizer as defined in claim 7, wherein said monitor circuit switches corresponding one of said plurality of control signals for at least one of said plurality of compensation variable capacitance diodes from a high level to a low level upon the voltage level of said control voltage signal exceeding said predetermined voltage range;
said monitor circuit switches corresponding one of said plurality of control signals for at least one of said plurality of compensation variable capacitance diodes from a low level to a high level upon the voltage level of said control voltage signal falling below said predetermined voltage range; and
said corresponding one of said plurality of time constant circuits supplies a DC bias voltage to corresponding one of said plurality of compensation variable capacitance diodes, smoothing out said switch from a high level to a low level or said switch from a low level to a high level into a slow voltage change so that said locked state is not canceled.

9. The frequency synthesizer as defined in claim 7, wherein said monitor circuit fixes the voltage levels of said plurality of control signals regardless of the voltage level of said control voltage signal upon said frequency synthesizer being in an unlocked state.

10. The frequency synthesizer as defined in claim 7, wherein said voltage-controlled oscillator further comprises at least one fixed capacitance serially and respectively connected to a switch, and said frequency synthesizer changes the capacitance value of said voltage-controlled oscillator by changing the connection of said switch upon said monitor circuit detects that said control voltage signal has gone out of said predetermined voltage range and it not being possible to bring back said control voltage signal into said predetermined voltage range by changing the DC bias voltages of said plurality of compensation variable capacitance diodes.

11. The frequency synthesizer as defined in claim 10, wherein said first variable capacitance diode, said plurality of compensation variable capacitance diodes, and said at least one fixed capacitance serially connected to said switch are substantially connected in parallel.

12. The frequency synthesizer as defined in claim 7, wherein said monitor circuit comprises a first voltage comparator that compares said control voltage signal with an upper limit voltage of said predetermined voltage range, a second voltage comparator that compares said control voltage signal with an lower limit voltage of said predetermined voltage range, and an up/down counter having an output signal of either said first or said second voltage comparator connected to its count-up signal input terminal and an output signal of the other voltage comparator connected to its countdown signal input terminal and reset upon said frequency synthesizer being in an unlocked state; and said monitor circuit changes the voltage levels of said plurality of control signals for said plurality of compensation variable capacitance diodes according to a count value of said up/down counter.

13. A method for controlling a frequency synthesizer, comprising:
providing a frequency synthesizer including
a phase comparator circuit that compares the phases of a reference clock and feedback clock;
a low-pass filter that smoothes an output signal of said phase comparator circuit and generates a control voltage signal;
a voltage-controlled oscillator that comprises a first variable capacitance diode whose DC bias voltage is controlled by said control voltage signal, a compensation variable capacitance diode, and another capacitance; and a feedback circuit that generates said feedback clock from a clock generated by said voltage-controlled oscillator;

the method further comprising:

in case where said frequency synthesizer is in a locked state, and said control voltage signal is out of a predetermined voltage range, and upon it being possible to bring said control voltage signal back within a predetermined voltage range via said phase comparator circuit and said low-pass filter circuit, changing a DC bias voltage of said compensation variable capacitance diode thereby changing an oscillation frequency of said voltage-controlled oscillator, changing the DC bias voltage of said compensation variable capacitance diode slowly so that said locked state is not canceled and said control voltage signal is brought back within a predetermined voltage range; and upon it being impossible to change the DC bias voltage of said compensation variable capacitance diode so as to bring said control voltage signal back within a predetermined voltage range, changing a capacitance value of said another capacitance and restarting the digital tuning of said voltage-controlled oscillator.

14. The method as defined in claim 13, wherein said another capacitance comprises at least one fixed capacitance on/off controlled by a switch and, wherein said changing said capacitance value of said another capacitance and said restarting the digital tuning of said voltage-controlled oscillator comprises switching said switch to change a capacitance value of said voltage-controlled oscillator.

* * * * *